(12) United States Patent
Du et al.

(10) Patent No.: US 12,027,413 B2
(45) Date of Patent: Jul. 2, 2024

(54) SEMICONDUCTOR STRUCTURE AND METHOD OF FABRICATING THE SAME

(71) Applicant: Vanguard International Semiconductor Corporation, Hsinchu (TW)

(72) Inventors: Yang Du, Hsinchu (TW); Yung-Fong Lin, Taoyuan (TW); Tsung-Hsiang Lin, New Taipei (TW); Yu-Chieh Chou, New Taipei (TW); Cheng-Tao Chou, Yunlin County (TW); Yi-Chun Lu, Taichung (TW); Chun-Hsu Chen, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 280 days.

(21) Appl. No.: 17/408,471

(22) Filed: Aug. 22, 2021

(65) Prior Publication Data

US 2023/0058295 A1     Feb. 23, 2023

(51) Int. Cl.
*H01L 21/762*     (2006.01)
*H01L 27/12*     (2006.01)

(52) U.S. Cl.
CPC ........ *H01L 21/76251* (2013.01); *H01L 27/12* (2013.01)

(58) Field of Classification Search
CPC ............... H01L 21/76251; H01L 27/12; H01L 23/3755; H01L 21/2007; H01L 21/02488; H01L 21/0242; H01L 21/02422
See application file for complete search history.

(56) References Cited

U.S. PATENT DOCUMENTS

| 10,790,143 | B1* | 9/2020 | Lin | ................... | H01L 21/02458 |
| 10,910,272 | B1* | 2/2021 | Zhou | ..................... | H10B 43/40 |
| 2008/0157235 | A1 | 7/2008 | Rogers | | |
| 2008/0160757 | A1 | 7/2008 | Han | | |
| 2016/0148858 | A1 | 5/2016 | Lee | | |
| 2022/0314357 | A1* | 10/2022 | Nishimura | ......... | B23K 15/0046 |

FOREIGN PATENT DOCUMENTS

| CN | 112352310 A | 2/2021 |
| TW | 200941578 A1 | 10/2009 |
| TW | 201203320 A1 | 1/2012 |
| TW | 202030891 A | 8/2020 |
| TW | 202036900 A | 10/2020 |

* cited by examiner

*Primary Examiner* — Latanya N Crawford Eason
(74) *Attorney, Agent, or Firm* — Winston Hsu

(57) ABSTRACT

A semiconductor structure includes a ceramic substrate, a first bonding layer, a second bonding layer, a cavity, and a semiconductor layer. The ceramic substrate includes holes on its surface. The first bonding layer is disposed on the surface of the ceramic substrate, and the second bonding layer is bonded to the first bonding layer. The cavity is disposed above the hole and enclosed by the first bonding layer and the second bonding layer. The semiconductor layer extends over the cavity and is disposed along the surface of the second bonding layer.

10 Claims, 8 Drawing Sheets

SEMICONDUCTOR STRUCTURE AND METHOD OF FABRICATING THE SAME

BACKGROUND OF THE INVENTION

1. Field of the Invention

This disclosure relates to a semiconductor structure, and more particularly to a semiconductor structure including a ceramic substrate and a manufacturing method thereof.

2. Description of the Prior Art

With the development of 5G communication and electric vehicle industry, the demand for high-frequency and high-power semiconductor devices is growing, such as high-frequency transistors, high-power field effect transistors, or high electron mobility transistors (HEMT). Semiconductor devices with high frequency and high power are generally adopted for semiconductor compounds, for example, III-V semiconductor compounds such as gallium nitride and silicon carbide, which have the characteristics of high frequency, high voltage resistance and low on resistance. In addition, in order to improve the heat dissipation effect, the ceramic substrate is generally used as the bearing substrate of the semiconductor element.

However, because ceramic substrates are usually formed by a sintering process, holes and pores are distributed on the surface and in the ceramic substrates, and the diameter of some holes and pores may be larger than 10 μm. A flat and complete surface is required since ceramic substrates are used to carry other stack layers. If there are holes on the surface, it will cause cracks or defects in the stack layers above the ceramic substrate. Generally speaking, a filling layer may be formed on the surface of the ceramic substrate to eliminate holes with smaller diameter (≤10 μm), but holes with larger diameter (>10 μm) would still not be eliminated by a deposition process.

Therefore, it is necessary to provide an improved semiconductor structure and the manufacturing method thereof to solve the drawbacks in the prior art.

SUMMARY OF THE INVENTION

In view of this, this disclosure provides a semiconductor structure and the manufacturing method thereof to solve the technical problems faced by the prior art.

According to one embodiment of the present disclosure, a semiconductor structure is disclosed, which comprises a ceramic substrate, a first bonding layer, a second bonding layer, a cavity, and a semiconductor layer; wherein the ceramic substrate comprises holes on the surface thereof. The first bonding layer is disposed on a surface of the ceramic substrate, and the second bonding layer is bonded to the first bonding layer. The cavity is disposed above the holes and enclosed by the first bonding layer and the second bonding layer. The semiconductor layer extends over the cavity and is disposed along the surface of the second bonding layer.

According to another embodiment of the present disclosure, a manufacturing method of a semiconductor structure is disclosed, which includes the following steps. Providing a first wafer structure, wherein the first wafer structure comprises a ceramic substrate and a first bonding layer, wherein the ceramic substrate comprises holes on a surface of the ceramic substrate, and the first bonding layer is disposed on the surface of the ceramic substrate, and a portion of the first bonding layer fills the holes. Providing a second wafer structure, wherein the second wafer structure comprises a semiconductor layer and a second bonding layer disposed on a surface of the semiconductor layer. Bonding the first wafer structure and the second wafer structure so that the first bonding layer and the second bonding layer enclose a cavity, wherein the cavity overlaps the holes.

According to the embodiments of the present disclosure, by forming the first bonding layer in the holes and on the surface of the ceramic substrate followed by using a wafer bonding process, the second bonding layer and the semiconductor layer can be completely transferred onto the ceramic substrate. Therefore, the semiconductor layer can extend completely across the holes located on the surface of the ceramic substrate without breaking or cracking.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the corresponding drawings. Through the specific embodiments in the following detailed description and referring to the corresponding drawings, the specific embodiments of this disclosure will be explained in detail, and the working principle of the specific embodiments of this disclosure will be explained.

DETAILED DESCRIPTION

Figure 1:
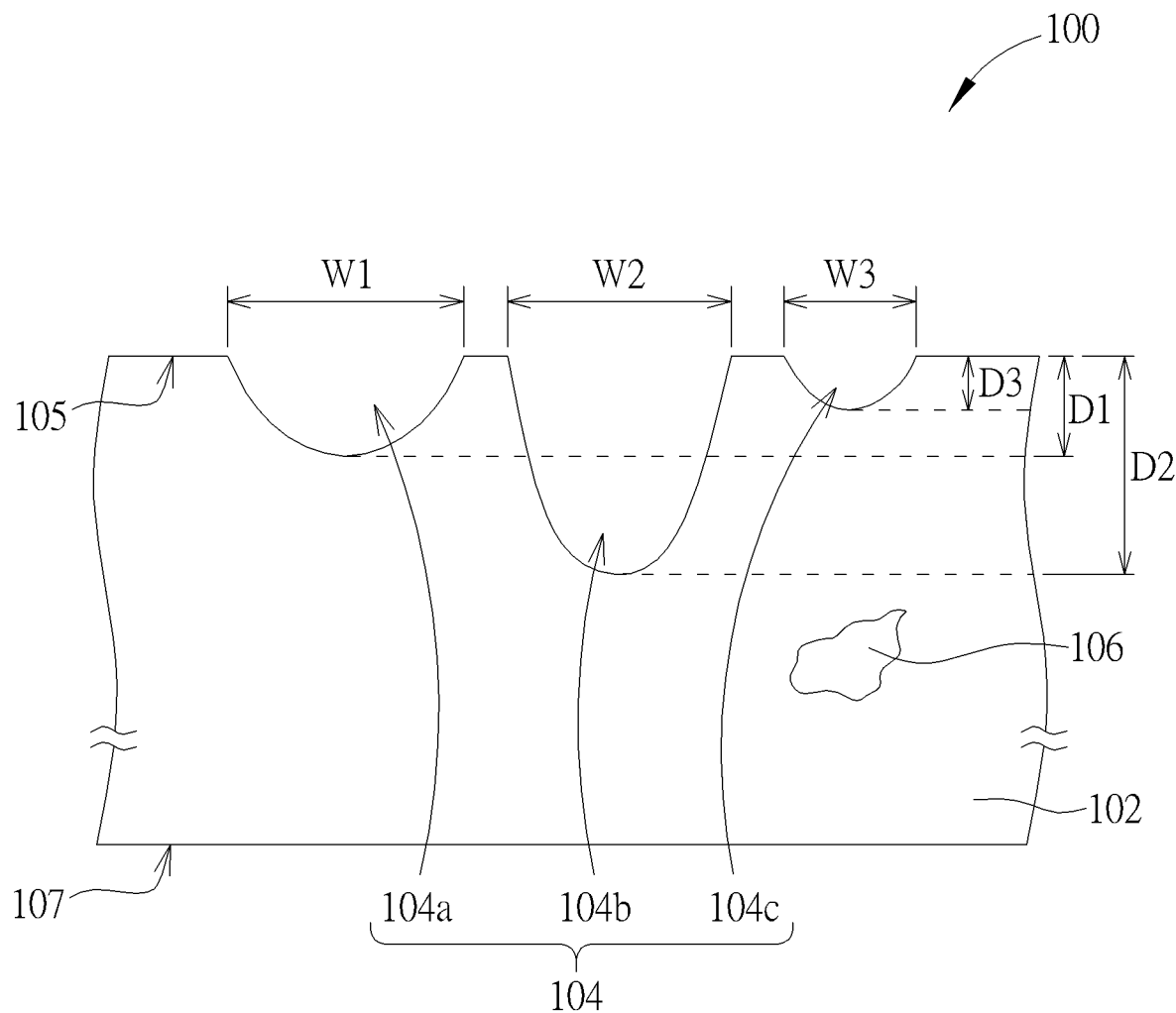
FIG. 1 is a schematic cross-sectional view of a first wafer structure including holes according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting.

For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "over," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that may vary as desired.

The terms, such as "coupled to" and "electrically coupled to", disclosed herein encompass all means of directly and indirectly electrical connection. For example, when an element or layer is referred to as being "coupled to" or "electrically coupled to" another element or layer, it may be directly coupled or electrically coupled to the other element or layer, or intervening elements or layers may be presented.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person of ordinary skill in the art.

Figure 8:
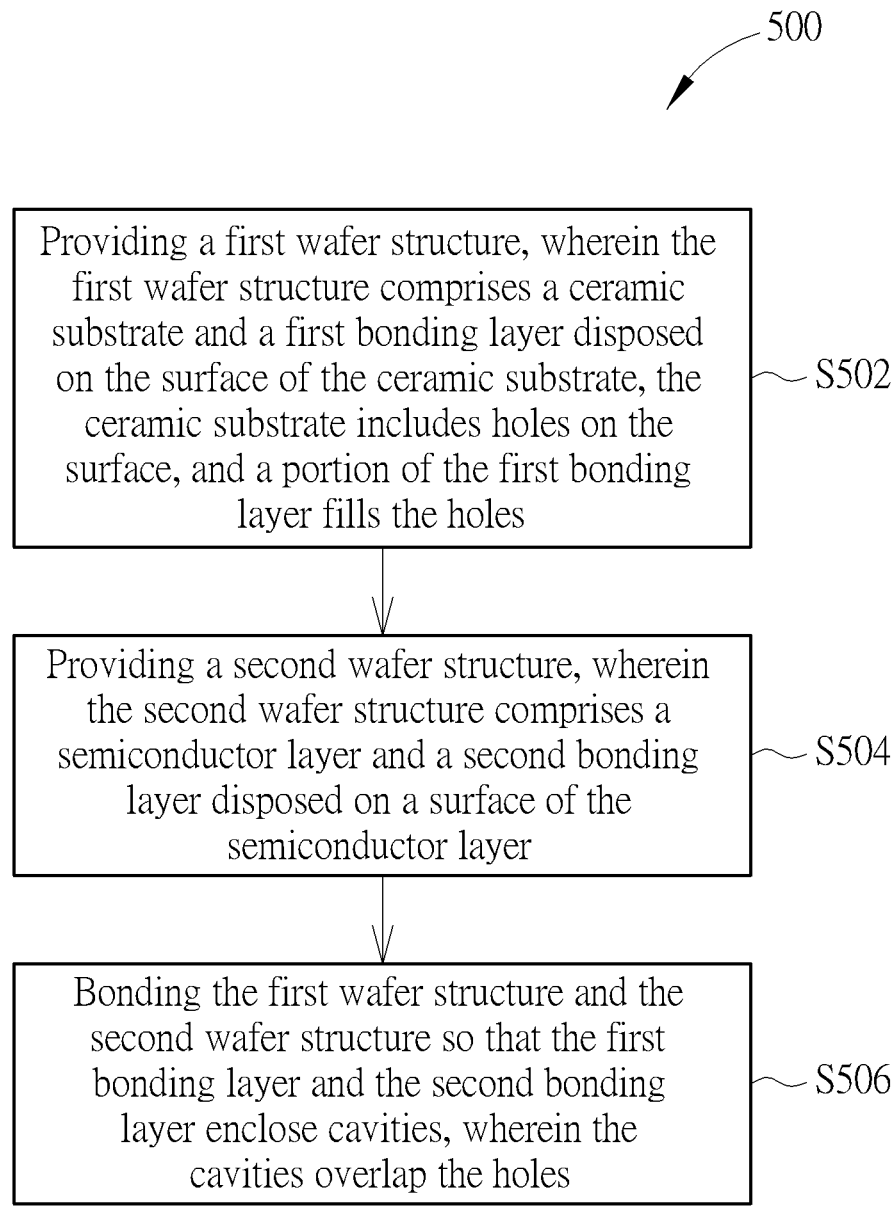
FIG. 8 is a flowchart illustrating a manufacturing method of a semiconductor structure according to one embodiment of the present disclosure.

FIG. 1 is a schematic cross-sectional view of a first wafer structure including holes according to one embodiment of the present disclosure. FIG. 8 is a flowchart illustrating a manufacturing method of a semiconductor structure according to one embodiment of the present disclosure. According to one embodiment of the present disclosure, step S502 of the manufacturing method 500 may be performed to provide a first wafer structure, which includes a ceramic substrate and a first bonding layer disposed on the surface of the ceramic substrate, where the ceramic substrate includes holes on its surface, and part of the first bonding layer fills the holes. According to one embodiment of the present disclosure, step S502 may include a plurality of steps, such as the steps shown in FIGS. 1-3. As shown in FIG. 1, at the initial stage of step S502, a first wafer structure 100 may be provided, where the first wafer structure 100 may be a whole wafer or a spit wafer after splitting. The first wafer structure 100 may include a ceramic substrate 102, or further include a carrier substrate (not shown) firmly attached to the bottom surface 107 of the ceramic substrate 102. According to embodiments of the present disclosure, the composition of the ceramic substrate 102 may include porous single-crystal or polycrystalline ceramic materials, such as alumina ($Al_2O_3$), aluminum nitride (AlN), gallium nitride (GaN), aluminum gallium nitride (AlGaN), silicon carbide (SiC), or other ceramic materials. Since the composition of the ceramic substrate 102 include porous materials, the top surface 105 and the interior of the ceramic substrate 102 may include at least one hole 104 or at least one pore 106 respectively, for example, dozens or hundreds of holes located on the top surface 105 and dozens or hundreds of pores located inside the ceramic substrate 102. The largest inner diameters of each hole 104 and pore 106 of the ceramic substrate 102 can be in the range of 1 μm to 20 μm. According to one embodiment of the present disclosure, the top surface 105 of the ceramic substrate 102 may include at least a first hole 104a, a second hole 104b, and a third hole 104c, while the interior of the ceramic substrate 102 may include at least a pore 106. The first hole 104a, the second hole 104b and the third hole 104c may have the same or different depths and widths, for example, the first hole 104a may have a first depth D1 and a first width W1, the second hole 104b may have a second depth D2 and a second width W2, and the third hole 104c may have a third depth D3 and a third width W3. The depths of holes from deep to shallow is the second depth D2, the first depth D1 and the third depth D3 (i.e. D2>D1>D3), and the widths of holes from wide to narrow is the first width W1, the second width W2 and the third width W3 (i.e. W1>W2>D3). According to one embodiment of the present disclosure, the depth and/or width of at least one hole is in the range of 10 μm to 30 μm. For example, the first depth D1 and the first width W1 of the first hole 104a may both be greater than 10 μm, and the second depth D2 and the second width W2 of the second hole 104b may both be greater than 10 μm. However, the third depth D3 and the third width W3 of the third hole 104c are both less than 10 μm.

According to one embodiment of the present disclosure, the ceramic substrate 102 is a substrate with high mechanical strength, for example, a ceramic substrate with higher mechanical strength than a single crystal silicon substrate, and thus the top surface 105 of the ceramic substrate 102 is not easily removed or planarized by a polishing process. In addition, the top surface 105 of the ceramic substrate 102 or the inner walls of the holes 104a-104c may include optional coating materials (not shown), such as aluminum oxide ($Al_2O_3$), yttrium oxide ($Y_2O_3$), or zirconium dioxide ($ZrO_2$), which is used to modify the surface characteristics of the ceramic substrate 102, but is not limited thereto.

Figure 2:
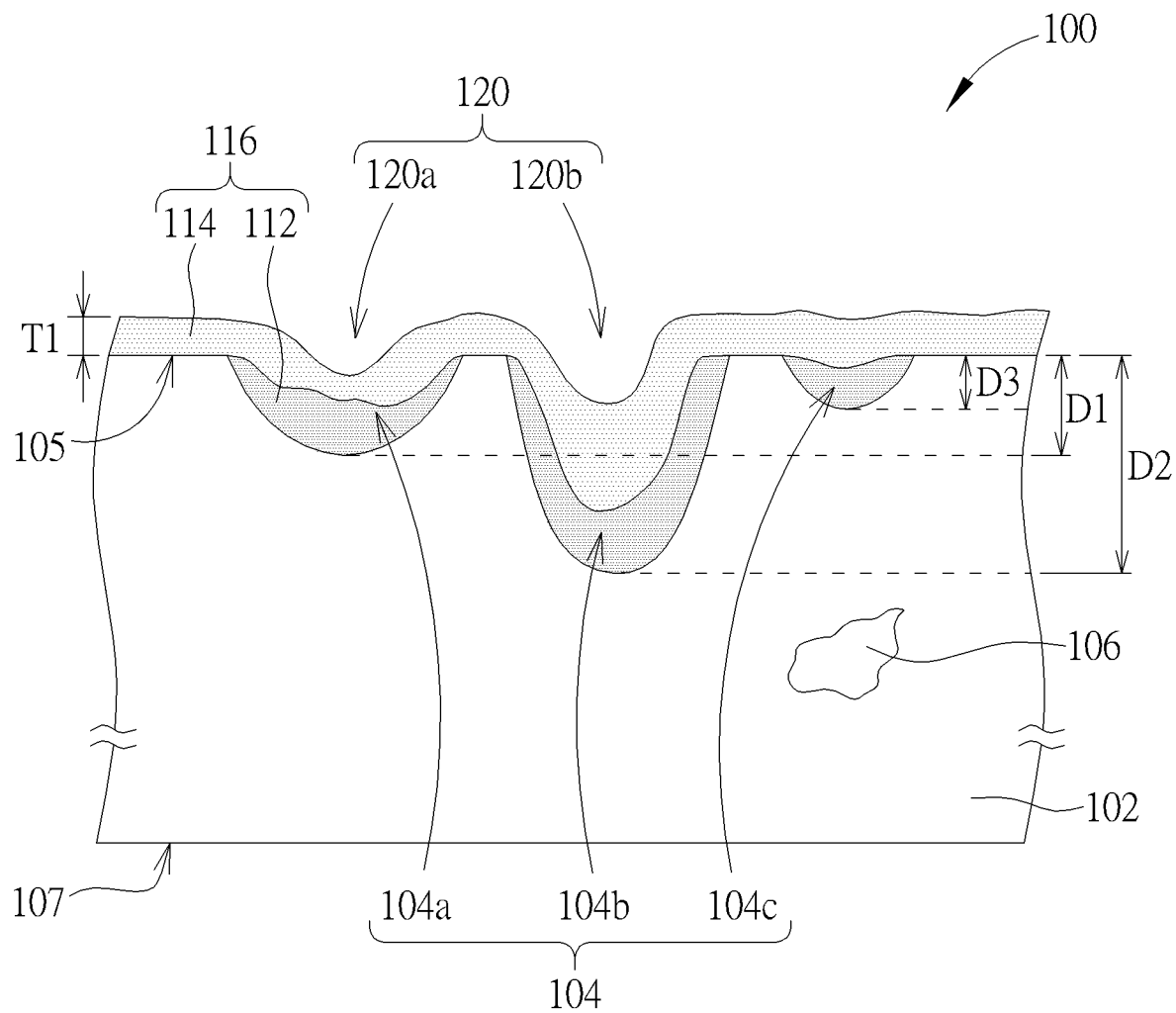
FIG. 2 is a schematic cross-sectional view of a semiconductor device according to one embodiment of the present disclosure.

FIG. 2 is a schematic cross-sectional view of a structure after a first bonding layer is disposed in holes of a ceramic substrate according to one embodiment of the present disclosure. After completing the steps shown in FIG. 1, step S502 may be performed to thereby form a first bonding layer 116 on the top surface 105 of the ceramic substrate 102, and fill a part of the first bonding layer 116 into the holes 104. According to one embodiment of the present disclosure, the material of the first bonding layer 116 includes a material suitable for wafer bonding, and the material thereof is different from the material of the ceramic substrate 102. For example, the material of the first bonding layer 116 may include silicon-containing dielectric materials, such as silicon oxide, silicon nitride, and so forth, but not limited thereto. The thickness (i.e. first thickness T1) of the first bonding layer 116 is in a range of 0.5 µm to 5 µm and the first thickness T1 is smaller than the depths D1, D2 of the first hole 104a and the second hole 104b. In addition, the first bonding layer 116 may be a single-layer structure or a multi-layer structure, for example, a double-layer stacked structure composed of the first filling layer 112 and the second filling layer 114. According to an embodiment of the present disclosure, the first filling layer 112 and the second filling layer 114 may include the same material, such as silicon oxide, and the first filling layer 112 may be formed by a deposition process with better gap filling capability, such as a flowable chemical vapor deposition (FCVD) process or a spin coating process. For example, the step of forming the first filling layer 112 may include first using a flowable chemical vapor deposition (FCVD) process or a spin coating process to fill the holes 104 with a flowable precursor, where the precursor may be a liquid siloxane, but is not limited thereto. Then, the precursor may be further transformed into a solid first filling layer 112. In contrast, for the step of forming the second filling layer 114, the step may be selected from any deposition process that is capable of making the first filling layer 112 completely covered with the second filling layer 114, and is not limited to the deposition processes with better gap filling capability. The deposition process for forming the second filling layer 114 may be such as a low pressure chemical vapor deposition (LPCVD) process, a plasma enhanced chemical vapor deposition (PECVD) process, or an atomic layer deposition (ALD) process, but not limited thereto. Since the first bonding layer 116 not only extends over the top surface 105, but also fills the holes 104, the adhesion between the first bonding layer 116 and the ceramic substrate 102 can be improved.

By forming the first bonding layer 116, the first bonding layer 116 may fill up the smaller hole 104, such as the third hole 104c. However, for the larger holes 104, such as the first holes 104a and the second holes 104b, because their depths and/or widths are greater than 10 they cannot be filled up by the first bonding layer 116 with a thickness less than 5 which causes the surface of the first bonding layer 116 to include at least one recess 120, such as a first recess 120a and a second recess 120b. The first recess 120a and the second recess 120b are located directly above the first hole 104a and the second hole 104b, respectively, and the lowest portions of the first recess 120a and the second recess 120b are still lower than the top surface 105 of the ceramic substrate 102. According to one embodiment of the present disclosure, if it is tried to fill up the first holes 104a and the second holes 104b, the first thickness T1 of the first bonding layer 116 may be excessively increased, which not only greatly increase the time for forming the first bonding layer 116 during the deposition, but also greatly increase the surface roughness of the first bonding layer 116.

Figure 3:
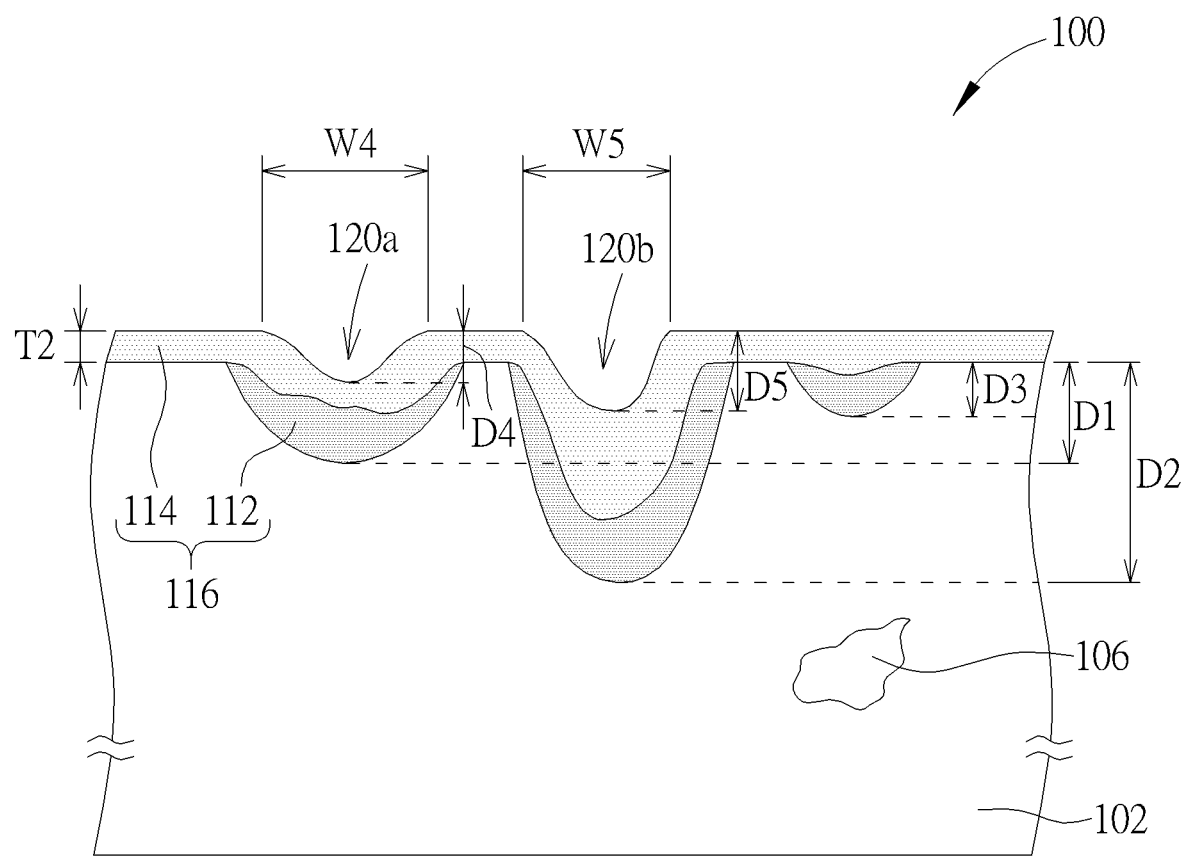
FIG. 3 is a schematic cross-sectional view of a structure after planarizing the first bonding layer according to one embodiment of the present disclosure.

FIG. 3 is a schematic cross-sectional view of a structure after planarizing the first bonding layer according to one embodiment of the present disclosure. As shown in FIG. 3, after the steps shown in FIG. 2 are completed, still in step S502, the first bonding layer 116 is planarized to form a flat first bonding interface 130. In the subsequent process of bonding the first bonding interface 130 to the surface of other structures, the flat first bonding interface 130 can benefit stronger bonding. Through the above planarization process, the second thickness T2 of the first bonding layer 116 may be reduced down to 0.45 µm to 4.5 µm, and the second thickness T2 may be smaller than the first thickness T1 (i.e. initial thickness) before the planarization process. In addition, although the above planarization process may reduce the depths of the recesses 120 of the first bonding layer 116, the above planarization process is still incapable of completely removing all the recesses 120. According to one embodiment of the present disclosure, after the completion of the above planarization process, the first recess 120a and the second recess 120b still remain in the first bonding layer 116. The first recess 120a may have a fourth depth D4 and a fourth width W4, and the second recess 120b may have a fifth depth D5 and a fifth width W5, where the fourth depth D4 and the fifth depth D5 are both larger than the second thickness T2, and the fourth width W4 and the fifth width W5 are respectively smaller than the first width W1 and the second width W2.

Figure 4:
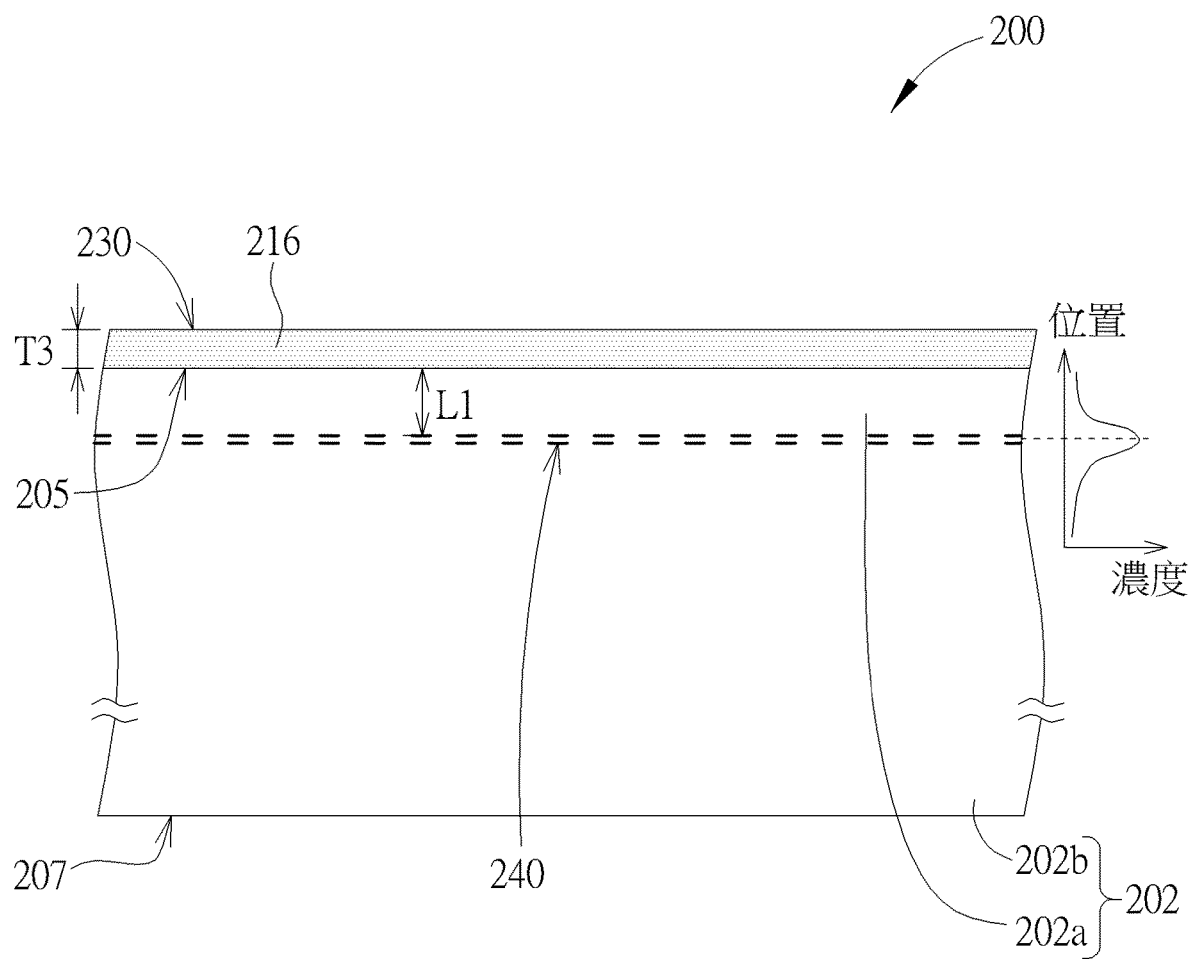
FIG. 4 is a schematic cross-sectional view of a second wafer structure according to one embodiment of the present disclosure.

FIG. 4 is a schematic cross-sectional view of a second wafer structure according to one embodiment of the present disclosure. According to one embodiment of the present disclosure, after the completion of step S502, step S504 may be performed to provide a second wafer structure including a semiconductor layer and a second bonding layer disposed on a surface of the semiconductor layer. According to one embodiment of the present disclosure, step S504 may include a plurality of sub-steps, for example, including the steps shown in FIG. 4. In addition, the timing for performing step S504 is not limited to be after the timing for performing step S502, but may be before step S502 or in parallel with step S502.

As shown in FIG. 4, in the initial stage of step S504, a second wafer structure 200 may be provided, where the second wafer structure 200 may be a whole wafer or a split wafer. According to one embodiment of the present disclosure, the second wafer structure 200 may include a second substrate 202, and the second substrate 202 includes a semiconductor layer 202a and a carrier layer 202b located below the semiconductor layer 202a. In the event that the second substrate 202 is a monolithic substrate, the semiconductor layer 202a and the carrier layer 202b may constitute a monolithic structure (or single crystal structure). According to one embodiment of the present disclosure, the monolithic substrate may be a single crystal silicon substrate or a single crystal III-V compound semiconductor substrate, but is not limited thereto. According to one embodiment of the present disclosure, depending on actual requirements, the semiconductor layer 202a and the carrier layer 202b may also correspond to different crystal forms or compositions. According to one embodiment of the present disclosure, the second wafer structure 200 may further include a carrier substrate (not shown) firmly attached to the bottom surface 207 of the second substrate 202 to thereby increase the overall mechanical strength of the second wafer structure 200.

Next, a protective layer (not shown), such as a silicon oxide layer, a silicon nitride layer, a silicon nitroxide layer or a silicon oxynitride layer, may be formed on a top surface 205 of the second substrate 202. Then, an ion implantation process may be performed under the protection of the protective layer to implant hydrogen-containing ions (such as $H^+$, $H_2^+$, or $H_3^+$) and/or helium-containing ions ($He^+$) into a predetermined position in the second substrate 202, thereby forming a dopant concentration distribution (i.e. dopant profile) including a single peak in the second substrate 202. The depth at which the peak of the dopant profile is formed may be regarded as a main existing area of a doped layer 240. With the doped layer 240 as the boundary, the second substrate 202 above the doped layer 240 is the semiconductor layer 202a, and the second substrate 202 below the doped layer 240 is the carrier layer 202b. According to one embodiment of the present disclosure, the dopant (such as hydrogen) concentration in the doped layer 240 may be from $1\times10^{20}$ atoms/cm$^3$ to $1\times10^{21}$ atoms/cm$^3$, and the distance L1 between the doped layer 240 and the top surface 205 of the second substrate 202 may be from 50 nm to 800 nm, depending on actual requirements. After forming the doped layer 240, the protective layer (not shown) on the top surface 205 may be removed to expose the top surface 205.

By implanting high-concentration hydrogen or helium into a partial region of the second substrate 202, the crystal structure of the doped region of the second substrate 202 can be destroyed, and tiny voids containing gas may be formed. In other words, the doped layer 240 may be used to reduce the adhesion between the semiconductor layer 202a and the carrier layer 202b. Therefore, when the second substrate 202 is subsequently subjected to heat treatment, the gas existing in the doped layer 240 may expand, which causes the semiconductor layer 202a and the carrier layer 202b to be separated from each other along the plane constituted by the doped layer 240.

Then, still referring to FIG. 4, an appropriate deposition process, such as a low pressure chemical vapor deposition (LPCVD) process, a plasma enhanced chemical vapor deposition (PECVD) process or an atomic layer deposition (ALD) process, may be performed to form a second bonding layer 216 on the top surface 205 of the second substrate 202. According to one embodiment of the present disclosure, the second bonding layer 216 may be a single-layer structure or a multi-layer structure, and the material thereof includes a material suitable for wafer bonding, and is different from the material of the second substrate 202, such as silicon-containing dielectric materials such as silicon oxide or silicon nitride, but not limited thereto. According to one embodiment of the present disclosure, during the process of forming the second bonding layer 216, the process temperature may be lower than the temperature at which the gas in the doped layer 240 rapidly escapes or expands. For example, the process temperature for forming the second bonding layer 216 may be lower than 350° C., but is not limited thereto. After forming the second bonding layer 216 by the deposition process, the second bonding layer 216 may be further planarized to form a flat second bonding interface 230. Therefore, in the subsequent process of bonding the second bonding interface 230 to the surface of other structures, the flat second bonding interface 230 may benefit stronger bond strength. Through the above planarization process, a third thickness T3 of the second bonding layer 216 may be thinned to from 0.45 μm to 4.5 μm.

Figure 5:
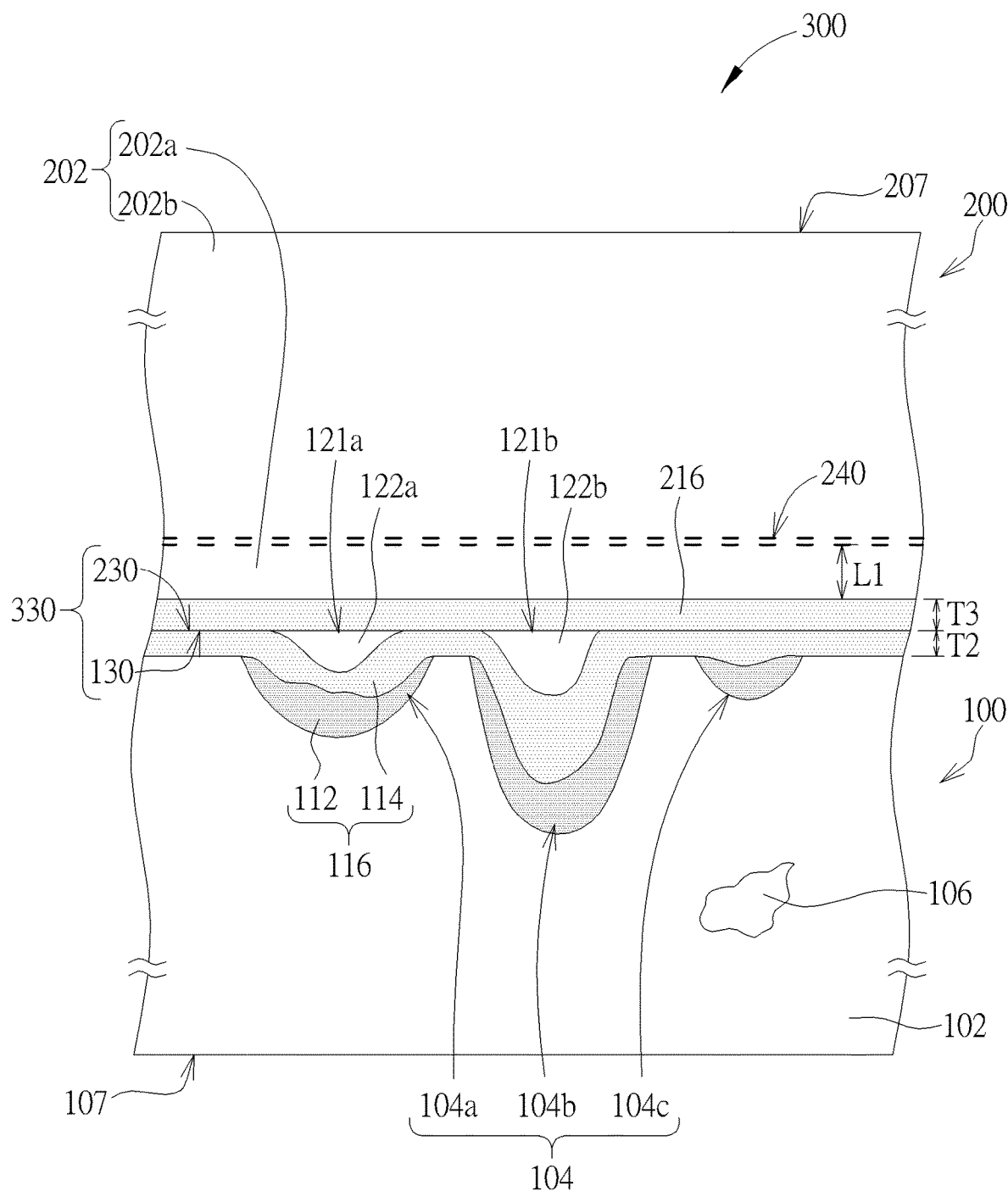
FIG. 5 is a schematic cross-sectional view of a structure after bonding the first bonding layer and the second bonding layer according to one embodiment of the present disclosure.

After the process shown in FIG. 4, step S506 may be performed to bond the first wafer structure and the second wafer structure, so that the first bonding layer and the second bonding layer enclose a cavity overlapping the holes of the ceramic substrate, and a structure similar to the structure shown in FIG. 5 may be obtained. FIG. 5 is a schematic cross-sectional view of a structure after bonding the first bonding layer and the second bonding layer according to one embodiment of the present disclosure. As shown in FIG. 5, the first wafer structure 100 and the second wafer structure 200 may be arranged face to face, and then the first wafer structure 100 may be bonded to the second wafer structure 200 at an appropriate temperature (e.g., normal temperature) and appropriate pressure to thereby form a semiconductor structure 300 where the first bonding layer 116 and the second bonding layer 216 enclose a first cavity 122a and a second cavity 122b. According to one embodiment of the present disclosure, through the bonding process, the first bonding interface 130 of the first wafer structure 100 may be covalently bonded (e.g., Si—O—Si) to the second bonding interface 230 of the second wafer structure 200 so as to form a bonding interface 330 (or contact surface), and partial edges 121a, 121b of the cavities 122a, 122b may be coplanar with the bonding interface 330. According to one embodiment of the present disclosure, before the bonding process is performed, the first bonding interface 130 and the second bonding interface 230 may be subjected to a plasma treatment process or an ozone treatment process, respectively, to increase the hydrophilicity of the surfaces. In addition, when the roughness (e.g., root mean square roughness, Rq) of the first bonding interface 130 and the second bonding interface 230 is less than 10 angstroms, e.g., 5 angstroms, the bond strength between them may be increased. In addition, the bond strength may also be increased by performing a heat treatment or a high-pressure treatment.

After the process steps shown in FIG. 5 are completed, a separation process may be performed on the semiconductor structure 300 to separate the carrier layer 202b from the semiconductor layer 202a. According to one embodiment of the present disclosure, in the process of separating the carrier layer 202b from the semiconductor layer 202a, the second substrate 202 may be subjected to a heat treatment at a temperature above 400° C. and below 700° C. to expand the gas in the doped layer 240 and thereby generate cracks in the doped layer 240. Then, an appropriate external force may be applied to split the second substrate 202 along the plane constituted by the doped layer 240 to form the structure shown in FIG. 6.

Figure 6:
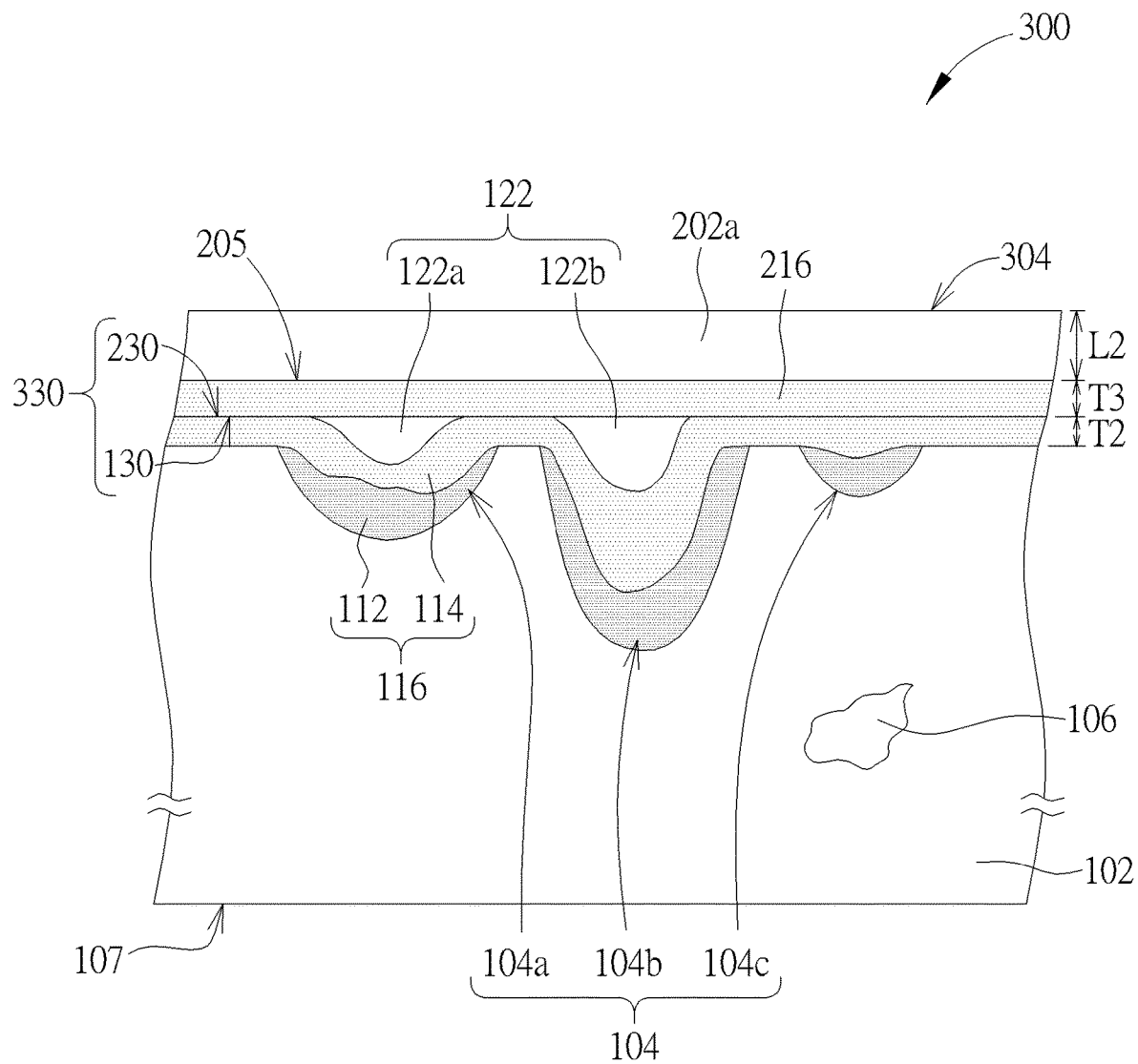
FIG. 6 is a schematic cross-sectional view of a structure after performing a separation process according to one embodiment of the present disclosure.

FIG. 6 is a schematic cross-sectional view of a structure after performing the separation process according to one embodiment of the present disclosure. As shown in FIG. 6, after performing the above separation process, the semiconductor layer 202a and the second bonding layer 216 can be completely transferred onto the first bonding layer 116 without generating discontinuous interrupted regions therein. In other words, the semiconductor layer 202a and the second bonding layer 216 may completely cover the surface of the ceramic substrate 102 and completely extend above the holes 104 and the cavities 122. According to one embodiment of the present disclosure, in order to further reduce surface defects or increase flatness of a exposed surface 304 of the semiconductor layer 202a, the exposed surface 304 of the semiconductor layer 202a may be further subjected to a polishing process (or CMP process) or a laser treatment process. In addition, the distance L2 between the exposed surface 304 and the top surface 205 of the semiconductor layer 202a may be slightly smaller than the original distance L1, and may be from 50 nm to 800 nm.

Figure 7:
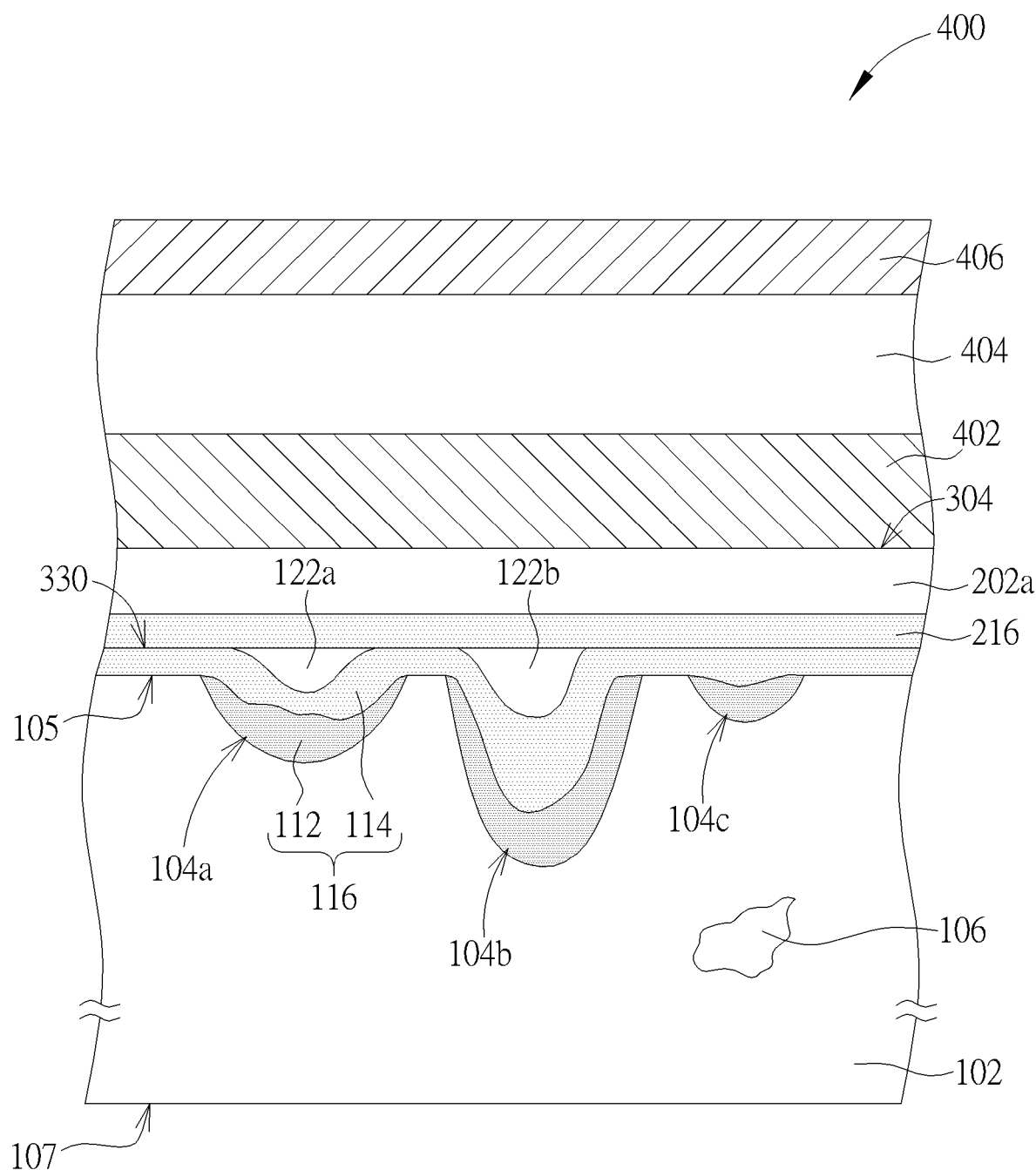
FIG. 7 is a schematic cross-sectional view of a structure after forming a device layer according to one embodiment of the present disclosure.

FIG. 7 is a schematic cross-sectional view of a structure after forming a device layer according to one embodiment of the present disclosure. As shown in FIG. 7, after the structure shown in FIG. 6 is obtained, other layers, such as a buffer layer 402, a semiconductor stack 404, and a device layer 406, may be sequentially stacked on the semiconductor layer 202a to form a semiconductor structure 400. The buffer layer 402 may include a plurality of III-V semiconductor sub-layers. In some embodiments, the material of the buffer layer 402 may include aluminum nitride, gallium nitride (GaN), aluminum gallium nitride ($Al_xGa_{1-x}N$, where 0<x<1), other suitable materials, or a combination of the foregoing. The semiconductor stack 404 may include a plurality of semiconductor sub-layers, for example, a plurality of III-V semiconductor sub-layers, and each of semiconductor sub-layers comprises gallium nitride (GaN), indium phosphide (InP), aluminum arsenide (AlAs), gallium arsenide (GaAs), aluminum gallium nitride (AlGaN), indium aluminum gallium nitride (InAlGaN) or indium gallium nitride (InGaN), aluminum nitride (AlN), gallium indium phosphide (GaInP), aluminum gallium arsenide (AlGaAs), aluminum indium arsenide (InAlAs), indium gallium arsenide (InGaAs), but not limited thereto. The device layer 406 may be provided with high voltage transistors including such as gate electrodes, source/drain electrodes, plugs, interconnects, dielectric layers, passivation layers or other components or layers, and some components or layers in the device layer 406 may extend into the semiconductor stack 404.

According to the above embodiments, the second bonding layer and the semiconductor layer can be completely transferred onto the ceramic substrate by forming the first bonding layer in the holes and on the surface of the ceramic substrate follows by using a wafer bonding process. Therefore, the semiconductor layer can extend completely across each hole located on the surface of the ceramic substrate without generating interrupted portions or cracks in the semiconductor layer or in each stacked layer on the semiconductor layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a ceramic substrate, comprising a surface and at least one hole on the surface;
   a first bonding layer, disposed on the surface of the ceramic substrate;
   a second bonding layer, bonded to the first bonding layer;
   at least one cavity, disposed above the at least one hole and enclosed by the first bonding layer and the second bonding layer; and
   a semiconductor layer, extending over the cavity and disposed along a surface of the second bonding layer.

2. The semiconductor structure of claim 1, wherein at least one of the depth and the width of the at least one hole is in a range of 10 µm to 30 µm.

3. The semiconductor structure of claim 1, wherein the depth of the at least one hole is greater than the thickness of the first bonding layer.

4. The semiconductor structure of claim 1, wherein a material of the first bonding layer is different from a material of the ceramic substrate.

5. The semiconductor structure of claim 1, wherein materials of the first bonding layer and the second bonding layer comprise silicon-containing oxides.

6. The semiconductor structure of claim 1, wherein the first bonding layer comprises a first filling layer and a second filling layer, wherein the second filling layer fills the at least one hole and the second filling layer is disposed on the first filling layer.

7. The semiconductor structure of claim 1, wherein:
   a contact surface is between the first bonding layer and the second bonding layer; and
   at least one edge of the at least one cavity is coplanar with the contact surface.

8. The semiconductor structure of claim 1, wherein the second bonding layer covers the surface of the ceramic substrate and extends across the at least one hole and the at least one cavity.

9. The semiconductor structure of claim 1, wherein the semiconductor layer is in direct contact with the second bonding layer and conformally disposed along the surface of the second bonding layer.

10. The semiconductor structure of claim 1, further comprising a device layer, wherein the device layer is disposed on the semiconductor layer and comprises at least one electrode, an interconnection structure, and at least one dielectric layer.

* * * * *